(12) United States Patent
Cheng et al.

(10) Patent No.: US 11,633,917 B2
(45) Date of Patent: Apr. 25, 2023

(54) LASER ADDITIVE MANUFACTURING CONTROL SYSTEM AND METHOD

(71) Applicant: Robert Bosch GmbH, Stuttgart (DE)

(72) Inventors: Bo Cheng, Malden, MA (US); Charles Tuffile, Swansea, MA (US)

(73) Assignee: Robert Bosch GmbH, Stuttgart (DE)

( * ) Notice: Subject to any disclaimer, the term of this patent is extended or adjusted under 35 U.S.C. 154(b) by 665 days.

(21) Appl. No.: 16/694,716

(22) Filed: Nov. 25, 2019

(65) Prior Publication Data
US 2021/0154939 A1 May 27, 2021

(51) Int. Cl.
*G06F 19/00* (2018.01)
*B29C 64/393* (2017.01)
(Continued)

(52) U.S. Cl.
CPC .......... *B29C 64/393* (2017.08); *B29C 64/245* (2017.08); *B29C 64/268* (2017.08); *B29C 64/364* (2017.08); *G06F 30/23* (2020.01); *B33Y 10/00* (2014.12); *B33Y 30/00* (2014.12); *B33Y 40/00* (2014.12); *B33Y 50/02* (2014.12)

(58) Field of Classification Search
CPC ... B29C 64/393; B29C 64/245; B29C 64/268; B29C 64/364; B29C 64/371; G06F 30/23; B33Y 10/00; B33Y 30/00; B33Y 40/00; B33Y 50/02; B22F 10/322; B22F 12/70
See application file for complete search history.

(56) References Cited

U.S. PATENT DOCUMENTS 10,232,439 B2   3/2019   Gold et al.
2018/0111319 A1   4/2018   Brezoczky et al.
(Continued)

FOREIGN PATENT DOCUMENTS

CN   102230943 B   7/2012
DE   102017222645 A1   6/2019
(Continued)

OTHER PUBLICATIONS

Cengel et al., "Fluid Mechanics: Fundamentals And Applications (Si Units)," Tata McGraw Hill Education Private Limited, 2010, 1228 pages.
(Continued)

*Primary Examiner* — Zhipeng Wang
(74) *Attorney, Agent, or Firm* — Brooks Kushman P.C.

(57) ABSTRACT

A computational method for controlling a powder particle uptake by a shielding gas in a laser additive manufacturing system. The computational method includes receiving a gas fluid domain, a powder bed domain, and an inlet shielding gas flow velocity of the laser additive manufacturing system. The method further includes determining a maximum gas flow velocity within the gas fluid domain based on the inlet shielding gas flow velocity and the gas fluid domain. The method also includes determining a threshold uptake flow velocity within the gas fluid domain based on the inlet shielding gas flow velocity and the powder bed domain. The method also includes controlling the powder particle uptake of the shielding gas in the laser additive manufacturing system in response to the maximum gas flow velocity and the threshold uptake flow velocity.

20 Claims, 8 Drawing Sheets

(51) Int. Cl.
- *B29C 64/245* (2017.01)
- *B29C 64/268* (2017.01)
- *B29C 64/364* (2017.01)
- *G06F 30/23* (2020.01)
- *B33Y 50/02* (2015.01)
- *B33Y 10/00* (2015.01)
- *B33Y 30/00* (2015.01)
- *B33Y 40/00* (2020.01)

(56) References Cited

U.S. PATENT DOCUMENTS

| | | | |
|---|---|---|---|
| 2018/0126650 A1 | 5/2018 | Murphree et al. | |
| 2018/0178287 A1 | 6/2018 | Mamrak et al. | |
| 2019/0099943 A1* | 4/2019 | Connell | B22F 10/20 |
| 2019/0322050 A1* | 10/2019 | Connell | B29C 64/364 |
| 2019/0322051 A1* | 10/2019 | Wakelam | B33Y 10/00 |
| 2019/0366639 A1 | 12/2019 | Barocio et al. | |
| 2020/0039000 A1* | 2/2020 | Sweetland | B33Y 30/00 |
| 2021/0101341 A1* | 4/2021 | Zhang | B22F 10/28 |

FOREIGN PATENT DOCUMENTS

| | | |
|---|---|---|
| WO | 2018143953 A1 | 8/2018 |
| WO | 2020120912 A1 | 6/2020 |

OTHER PUBLICATIONS

Chen et al., "Optimization of Inert Gas Flow inside Laser Powder-Bed Fusion Chamber with Computational Fluid Dynamics." Solid Freeform Fabrication 2018: Proceedings of the 29th Annual International Solid Freeform Fabrication Symposium—An Additive Manufacturing Conference, 2018, pp. 1931-1939.

Gunenthiram et al., "Experimental analysis of spatter generation and melt-pool behavior during the powder bed laser beam melting process," Journal of Materials Processing Technology, vol. 251, 2018, 12 pages.

Kruth et al., "Selective laser melting of iron-based powder," Journal of Materials Processing Technology, vol. 149, 2004, pp. 616-622, DOI: 10.1016/j.jmatprotec.2003.11.051.

Liu et al., "Investigation into spatter behavior during selective laser melting of AISI 316L stainless steel powder," Materials and Design, vol. 87, 2015, pp. 797-806, DOI: 10.1016/j.matdes.2015.08.086.

Ly et al., "Metal vapor micro-jet controls material redistribution in laser powder bed fusion additive manufacturing," Scientific Reports vol. 7, No. 4085, Jun. 22, 2017, 12 pages, DOI: 10.1038/s41598-017-04237-z.

Philo et al., "A Multiphase CFD Model for the Prediction of Particulate Accumulation in a Laser Powder Bed Fusion Process," TMS Annual Meeting & Exhibition, 2018, pp. 65-76, DOI: 10.1007/978-3-319-72059-3_7.

Philo et al., "A study into the effects of gas flow inlet design of the Renishaw AM250 laser powder bed fusion machine using computational modelling." Solid Freeform Fabrication 2017: Proceedings of the 28th Annual International Solid Freeform Fabrication Symposium—An Additive Manufacturing Conference Reviewed Paper, 2017, pp. 1203-1219.

Shao et al., "A simple expression for wind erosion threshold friction velocity," Journal of Geophysical Research, vol. 105, No. D17, Sep. 16, 2000, pp. 22437-22443.

Wang et al., "Flow analysis of the laminated manufacturing system with laser sintering of metal powder. Part I: flow uniformity inside the working chamber," The International Journal of Advanced Manufacturing Technology, vol. 92, Mar. 10, 2017, pp. 1299-1314, DOI: 10.1007/s00170-017-0213-5.

Zhao et al., "Real-time monitoring of laser powder bed fusion process using high-speed X-ray imaging and diffraction." Scientific Reports, vol. 7, No. 3602, Jun. 15, 2017, 11 pages, DOI: 10.1038/s41598-017-03761-2.

\* cited by examiner

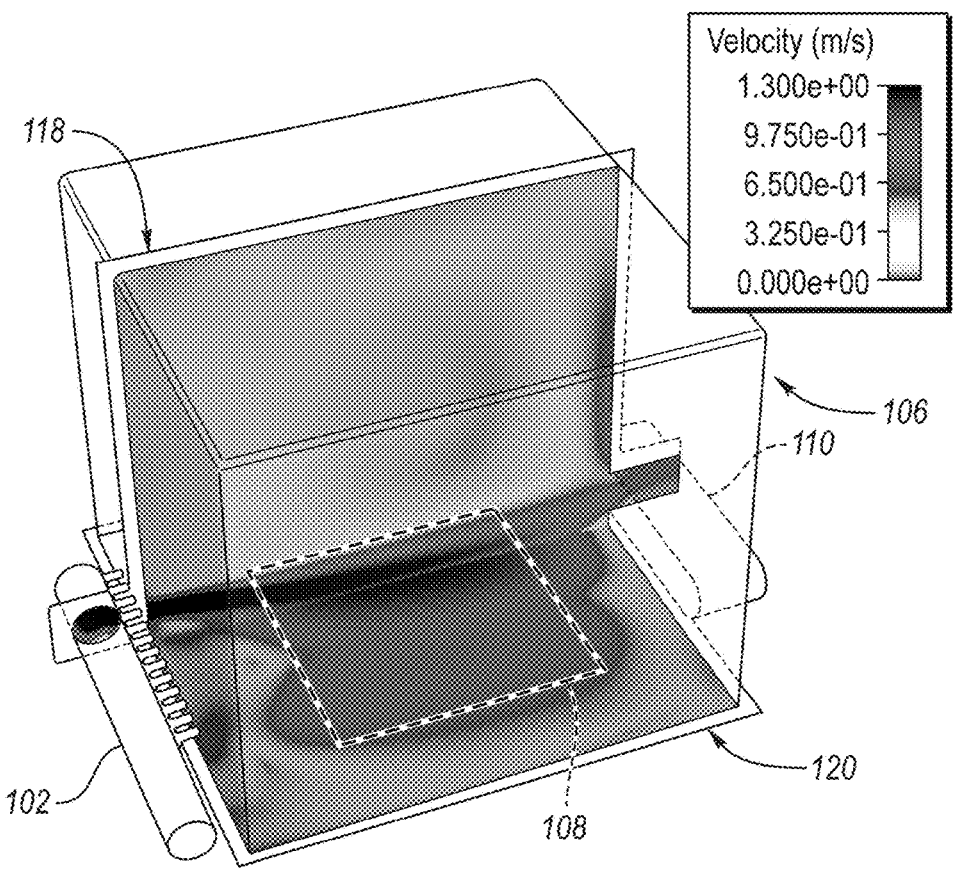
FIG. 5A
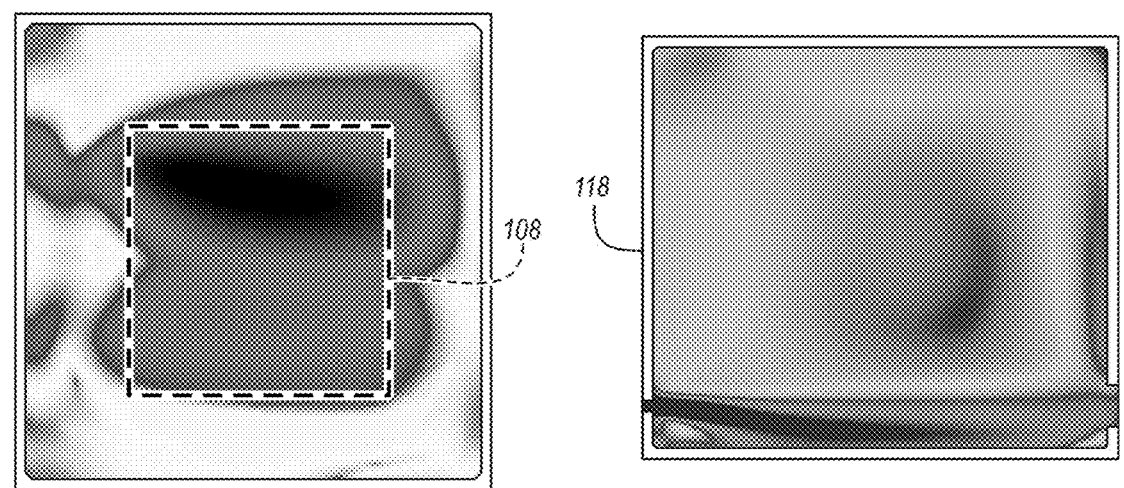
FIG. 5B
FIG. 5C

LASER ADDITIVE MANUFACTURING CONTROL SYSTEM AND METHOD

TECHNICAL FIELD

The present disclosure relates to a laser additive manufacturing control system and method.

BACKGROUND

Selective laser melting (SLM) is a laser additive manufacturing system and process that has attracted significant interest due to its potential to produce high-resolution and high-density parts from a variety of different metals and alloys. In an SLM process, a high-energy laser beam is utilized to melt and fuse metallic powder particles into a melt pool. Often, high local temperatures associated with the SLM process exceed the material evaporation point and cause evaporation. This vaporization process can cause a vapor-jet effect, which leads to the generation of emissions from the melt pool. Such emissions can include powder particles within the vapor jet and liquid droplets ejected from the melt pool as a result of strong surface tension effects. These ejected particles are commonly referred to as spatter. Such spatter may be redeposited on the powder particles and melt pool, thereby containing the build area and adversely affecting the build quality of the resulting part.

SUMMARY

According to one embodiment, a laser additive manufacturing system for controlling a powder particle uptake by a shielding gas is disclosed. The system includes an inlet configured to inlet a shielding gas flow, a main chamber configured to receive the shielding gas flow, an outlet configured to outlet the shielding gas flow, a substrate situated between the inlet and the outlet and configured to support a powder bed having a number of particles, a laser configured to melt pre-defined regions of the powder bed to form a melt pool and a controller having non-transitory memory for storing machine instructions that are to be executed by the controller and operatively connected to the inlet. The machine instructions when executed by the controller implement the following functions: receiving a gas fluid domain of the main chamber, a powder bed domain of the powder bed, and an inlet shielding gas flow velocity; determining a maximum gas flow velocity within the gas fluid domain based on the inlet shielding gas flow velocity and the gas fluid domain; determining a threshold uptake flow velocity within the gas fluid domain based on the inlet shielding gas flow velocity and the powder bed domain; and controlling the powder particle uptake of the shielding gas in the laser additive manufacturing system in response to the maximum gas flow velocity and the threshold uptake flow velocity.

According to another embodiment, a computational method for controlling a powder particle uptake by a shielding gas in a laser additive manufacturing system is disclosed. The method includes receiving a gas fluid domain, a powder bed domain, and an inlet shielding gas flow velocity of the laser additive manufacturing system; determining a maximum gas flow velocity within the gas fluid domain based on the inlet shielding gas flow velocity and the gas fluid domain; determining a threshold uptake flow velocity within the gas fluid domain based on the inlet shielding gas flow velocity and the powder bed domain; and controlling the powder particle uptake of the shielding gas in the laser additive manufacturing system in response to the maximum gas flow velocity and the threshold uptake flow velocity.

According to yet another embodiment, a computer readable medium is disclosed. The computer readable medium includes a non-transitory memory for storing machine instructions that are to be executed by a computer. The machine instructions when executed by the computer implement the following functions: receiving a gas fluid domain, a powder bed domain, and an inlet shielding gas flow velocity of a laser additive manufacturing system; determining a maximum gas flow velocity within the gas fluid domain based on the inlet shielding gas flow velocity and the gas fluid domain; determining a threshold uptake flow velocity within the gas fluid domain based on the inlet shielding gas flow velocity and the powder bed domain; and controlling a powder particle uptake of a shielding gas in the laser additive manufacturing system in response to the maximum gas flow velocity and the threshold uptake flow velocity.

BRIEF DESCRIPTION OF THE DRAWINGS

FIG. 5A depicts a schematic, perspective view of an SLM chamber showing vertical and horizontal velocity planes of a shielding gas flow using a pre-determined flow rate and a CFD computational method according to one embodiment.

FIG. 5B depicts a schematic, plan view of the horizontal flow velocity plane of FIG. 5A.

FIG. 5C depicts a schematic, plan view of the vertical flow velocity plane of FIG. 5A.

DETAILED DESCRIPTION

Figure 1A:
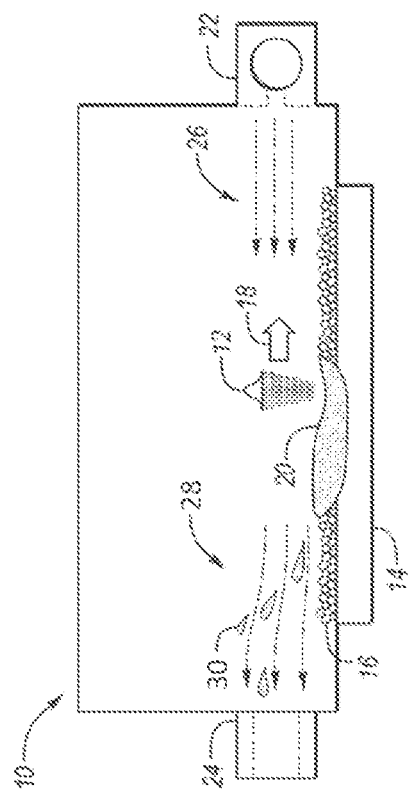
FIGS. 1A and 1B depict schematic, side views of an SLM build chamber showing an ideal gas flow and a non-ideal shielding gas flow, respectively.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The description of a group or class of materials as suitable for a given purpose in connection with one or more embodiments implies that mixtures of any two or more of the members of the group or class are suitable. Description of constituents in chemical terms refers to the constituents at the time of addition to any combination specified in the description and does not necessarily preclude chemical interactions among constituents of the mixture once mixed.

Except where expressly indicated, all numerical quantities in this description indicating dimensions or material properties are to be understood as modified by the word "about" in describing the broadest scope of the present disclosure.

The first definition of an acronym or other abbreviation applies to all subsequent uses herein of the same abbreviation and applies mutatis mutandis to normal grammatical variations of the initially defined abbreviation. Unless expressly stated to the contrary, measurement of a property is determined by the same technique as previously or later referenced for the same property.

Reference is being made in detail to compositions, embodiments, and methods of embodiments known to the inventors. However, it should be understood that disclosed embodiments are merely exemplary of the present invention which may be embodied in various and alternative forms. Therefore, specific details disclosed herein are not to be interpreted as limiting, rather merely as representative bases for teaching one skilled in the art to variously employ the present invention.

The term "substantially" or "about" may be used herein to describe disclosed or claimed embodiments. The term "substantially" or "about" may modify a value or relative characteristic disclosed or claimed in the present disclosure. In such instances, "substantially" or "about" may signify that the value or relative characteristic it modifies is within ±0%, 0.1%, 0.5%, 1%, 2%, 3%, 4%, 5%, or 10% of the value or relative characteristic.

Selective laser melting (SLM) is a non-limited example of a powder bed-based additive manufacturing process. In an SLM process, complex-shaped metal components are manufactured in a layer-by-layer fashion. In one example, one relatively thin layer of a metallic powder particle material is deposited upon a solid substrate or previously solidified material. Subsequently, a laser beam may be used to scan and melt one or more pre-defined regions of the relatively thin layer of the metallic powder particle material. Repeating the steps of melting and solidification of the layered metallic powder particle material generates a part, e.g., complex-shaped metal components.

One common issue to SLM and other powder bed-based laser additive manufacturing processes is the ejection of metallic powder particles from and around a melt pool forming during the melting steps. During an SLM process, a large number of ejected particles (otherwise known as spatter) can fall back to the powder bed or on already scanned and solidified regions of the particle due to gravity and/or the particle-gas flow interaction. The redeposited spatters may contaminate the surface of each layer and negatively affect the part quality, e.g., introducing porosity due to insufficient melting of the relatively large sized spatter. A shielding gas flow with an inlet flow rate may be used to remove spatter inside the SLM build chamber. The shielding gas flow attempts to entrain the spatter and move it away from the main build region (e.g., the powder bed) before the spatter falls back onto the build area (e.g., the powder bed and/or the melt pool).

While a shielding gas may be utilized to remove spatter from the build area of a powder bed-based additive manufacturing system, determining an appropriate flow rate or range of flow rates to achieve requisite spatter removal without causing other negative effects may be difficult. For instance, a shielding gas flow rate should be carefully decided because a relatively low shielding gas flow rate may not effectively remove spatter while a relatively high shielding gas flow rate may uptake metal powder particles from the powder bed. The uptake of metal powder particles may adversely affect the quality of the resulting part by redistributing the metal powder particles in the melt pool or an unwanted region of the powder bed. Moreover, the laser beam may directly irradiate a resulting thinner powder bed or a substrate supporting the powder bed once the powder particles are blown up from the substrate.

What is needed are a powder bed-based laser additive manufacturing control system, computational methods and computer readable storage medium having computer readable instruction thereon for causing a processor to carry out the computational methods, to effectively mitigate powder bed particle uptake. The present disclosure, in one or more embodiments, discloses computational methods to determine a threshold gas flow velocity based on a powder uptake phenomenon such that an inlet gas flow rate of an additive manufacturing build chamber is determined. In one or more embodiments, the powder bed-based laser additive manufacturing system may be controlled using the inlet gas flow rate determined using the computational methods of one or more embodiments. The computational methods may be implemented using a computer readable storage medium having computer readable program instructions thereon for causing a processor to carry out the computational methods.

Figure 1B:
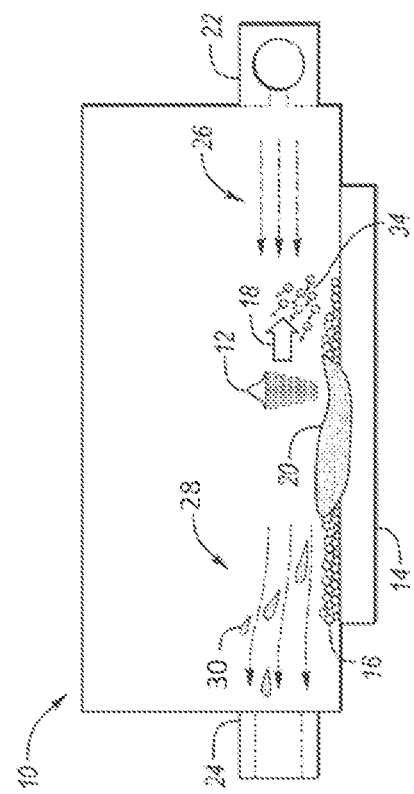

As stated above, an SLM process is a non-limiting example of a powder bed-based additive manufacturing process. FIGS. 1A and 1B depict schematic, side views of SLM build chamber 10 showing an ideal shielding gas flow and a non-ideal shielding gas flow, respectively. SLM build chamber 10 includes laser assembly 12 and build platform 14. Powder bed 16 is supported on build platform 14. During the SLM process, laser assembly 12 scans a pre-defined region of powder bed 16 in scan direction 18 to form melt pool 20. The scanning may proceed on a layer-by-layer basis of powder bed 16.

SLM build chamber 10 also includes gas flow inlet channel 22 and gas flow outlet 24. Gas flow inlet channel 22 may include one or more gas flow inlet nozzles for a shielding gas to flow through. The shielding gas may be an inert gas, such as Argon. As depicted by arrows 26, the shielding gas flows from gas flow inlet channel 22 toward gas flow outlet 24. As depicted by arrows 28, the shielding gas up takes spatter 30 to remove it from powder bed 16 and melt pool 20. According to the embodiment shown in FIG. 1A, this uptake is a result of an ideal shielding gas flow because the removal of spatter 30 does not affect powder bed 16. On the other hand, as depicted by arrows 32 on FIG. 1b, the shielding gas additionally up takes metallic powder particles 34 of powder bed 16. According to the embodiment shown in FIG. 1B, this uptake is a result of a non-ideal shielding gas flow because the removal of spatter 30 also uptakes metallic powder particles 34, thereby moving them to other regions of powder bed 16 and/or melt pool 20. In one or more embodiments, computational methods are utilized to determine a threshold gas velocity above powder bed 16 and an inlet gas flow rate related thereto.

In one embodiment, a computational method is configured to determine an inlet gas flow rate to achieve an efficient rate of spatter removal while preventing and/or minimizing metallic powder particle uptake. The efficient rate of spatter removal may be any of the following values or in a range of any two of the following values: 90%, 91%, 92%, 93%, 94%, 95%, 96%, 97%, 98%, 99% and 100%. The minimized metallic powder particle uptake rate may be any of the following values or in a range of any two of the following values: 0%, 0.01%, 0.1%, 0.5%, 1% and 2%. As part of the computational method, the interaction between the shielding gas fluid and the metallic powder particles is examined, and a threshold velocity of the shielding gas flow above powder bed 16 is determined to prevent or minimize metallic powder particle uptake during the spatter removal process.

In one embodiment, a computational method includes first and second computational steps. The first computational step may be a full-scale computational fluid dynamics (CFD) method configured to simulate gas flow characteristics in SLM build chamber 10. The full-scale CFD method may model a domain of a relatively large size, e.g., 100 to 900 millimeters in the X, Y and Z directions. In one or more embodiments, the full-scale CFD method of the first computational step does not model metallic powder particles because the metallic powder particles may be less than 100 micrometers. This significant size difference may make the full-scale CFD method unsuitable to model the metallic powder particles. In these circumstances, the full-size CFD method does not model the metallic powder particles. Rather, a second computational step of a reduced scale may be utilized.

The second computational step may be a reduced scale CFD method integrated with a fully coupled discrete element method (DEM) (CFD-DEM method) configured to simulate the effect of the gas flow characteristics on metallic powder particle motion. The reduced scale CFD-DEM method may model a domain of a relatively reduced size, e.g., 1 to 3 millimeters in the X, Y and Z directions. In one or more embodiments, metallic powder particle motion may be modelled using the reduced scale CFD-DEM method. The second computational step may be configured to determine maximum gas flow velocity at a pre-determined height above powder bed 16 based on different inlet flow rates in SLM build chamber 10. The pre-determined location above powder bed 16 may be any of the following values or in a range of any two of the following values: 0, 0.1, 0.2, 0.3, 0.4, 0.5, 0.6, 0.7, 0.8, 0.9 and 1.0 mm. The second computational step may be configured to determine a metallic powder particle uptake threshold velocity at the pre-determined height above the powder bed. Based on the output of the first and second steps of the computational method, the computational method is configured to determine the relationship between the metallic powder particle uptake threshold velocity and the inlet gas flow rate of the SLM build chamber.

Figure 2:
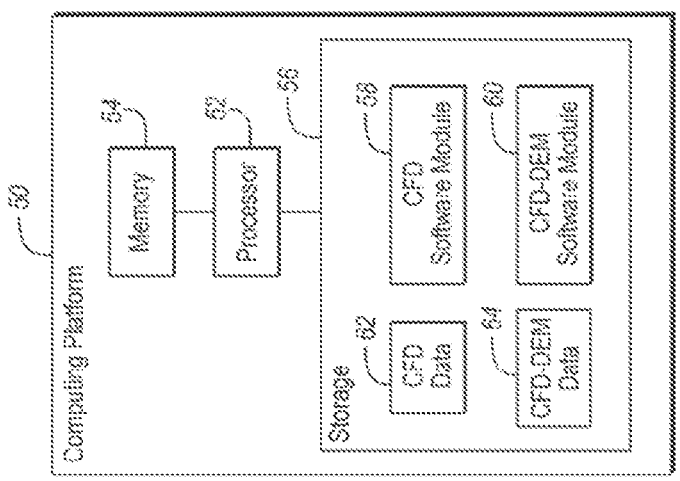
FIG. 2 is a schematic diagram of a computing platform that may be utilized to implement computational methods of one or more embodiments.

The computational methods and steps, including, but not limited to, the CFD computational methods and the CFD-DEM computational methods, of one or more embodiments are implemented using a computing platform, such as computing platform 50 illustrated in FIG. 2. The computing platform 50 may include a processor 52, memory 54, and non-volatile storage 56. The processor 52 may include one or more devices selected from high-performance computing (HPC) systems including high-performance cores, microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory 54. The memory 54 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information. The non-volatile storage 56 may include one or more persistent data storage devices such as a hard drive, optical drive, tape drive, non-volatile solid state device, cloud storage or any other device capable of persistently storing information.

Processor 52 may be configured to read into memory 54 and execute computer-executable instructions residing in CFD software module 58 and/or CFD-DEM software module 60 of the non-volatile storage 56 and embodying computational methodologies of one or more embodiments. Software modules 58 and/or 60 may include operating systems and applications. Software modules 58 and/or 60 may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL.

Upon execution by the processor 52, the computer-executable instructions of CFD software module 58 and/or CFD-DEM software module 60 may cause the computing platform 50 to implement one or more of the computing methodologies disclosed herein. Non-volatile storage 56 may also include CFD data 62 and CFD-DEM data 64 supporting the functions, features, calculations, and processes of the one or more embodiments described herein.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

Figure 3A:
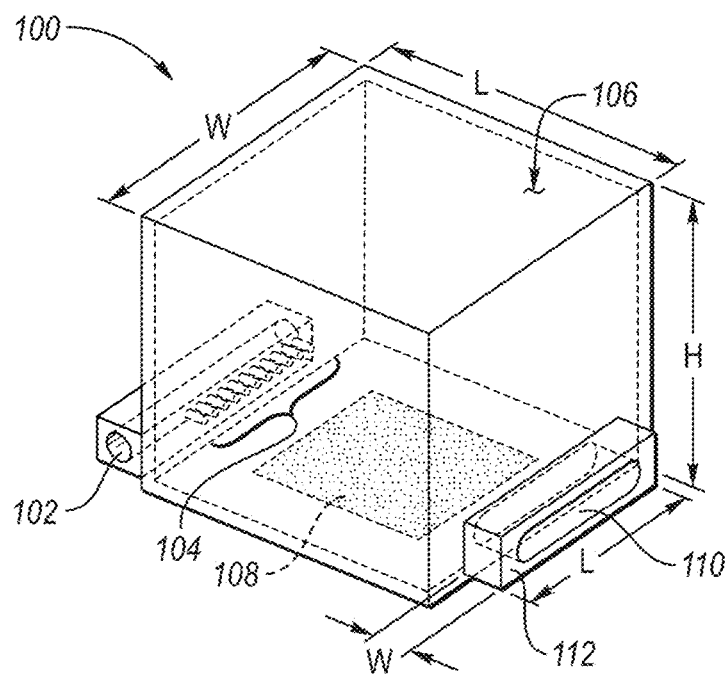
FIG. 3A depicts a schematic, perspective view of an SLM build chamber configured for use with computational methods of one or more embodiments.

FIG. 3A depicts a schematic, perspective view of SLM build chamber 100 configured for use with computational methods of one or more embodiments. SLM build chamber 100 has a width (W), length (L) and height (H). In one embodiment, W, L and H are 450 mm, 450 mm and 400 mm, respectively, but these dimensions may very significantly based on the design of the SLM build chamber. W may be any of the following values or in a range of any two of the following values: 100, 200, 300, 400, 500, 600, 700, 800 and 900 mm. L may be any of the following values or in a range of any two of the following values: 100, 200, 300, 400, 500, 600, 700, 800 and 900 mm. H may be any of the following values or in a range of any two of the following values: 100, 200, 300, 400, 500, 600, 700, 800 and 900 mm. W, L and H may be independently selected based on these values and ranges.

SLM build chamber 100 includes inlet rail 102 configured to receive a shielding gas flow and to direct the shielding gas flow through cylindrical nozzles 104. The diameter of inlet rail 102 may be any of the following values or in a range of any two of the following values: 35, 36, 37, 38, 39, 40, 41, 42, 43 and 44 mm. The axial centerline of inlet rail 102 may situated about 50 mm above the bottom of SLM build chamber 100. The axial length of inlet rail 102 may be any of the following values or in a range of any two of the following values: 320, 330, 340, 342, 350, 360 and 370 mm.

Cylindrical nozzles 104 are configured to direct the shielding gas flow into main chamber 106 of SLM build chamber 100 over powder bed 108 and toward outlet 110. In the embodiment shown in FIG. 3A, the number of cylindrical nozzles 104 is 13. The number of cylindrical nozzles 104 may be any of the following values or in a range of any two of the following values: 10, 11, 12, 13, 14, 15, 16, 17, 18, 19 and 20. In the embodiment shown in FIG. 3A, the diameter of each nozzle is 12 mm. The diameter of each cylindrical nozzle 104 may be any of the following values or in a range of any two of the following values: 10, 11, 12, 13, 14 and 15 mm. In the embodiment shown in FIG. 3A, the center to center distance is 18 mm. The center to center distance of adjacent cylindrical nozzles 104 may be any of the following values or in a range of any two of the following values: 15, 16, 17, 18, 19 and 20 mm.

Outlet 110 is partially surrounded by outlet housing 112. The width (W) of outlet housing may be any of the following values or in a range of any two of the following values: 45, 50, 55, 60, 65, 70 and 75 mm. The length (L) of outlet housing may be any of the following values or in a range of any two of the following values: 280, 290, 300, 310, 320, 330 and 340 mm. The shielding gas flow exits main chamber 106 through outlet 110.

In one or more embodiments, the computational methods simulate a shielding gas flow in main chamber 106 by assuming the shielding gas is transient, incompressible and/or turbulent. In one or more embodiments, the turbulent flow behavior may be modeled using a k-e turbulent flow model. According to one or more computational methods disclosed herein, an inlet boundary condition for the shielding gas flow through inlet rail 102 may be referred to as a volume flow rate and an outlet boundary condition for the shielding gas flow exiting through outlet 110 may be referred to as an outflow. A CFD method may be utilized to simulate the shielding gas flow in main chamber 106.

Figure 3B:
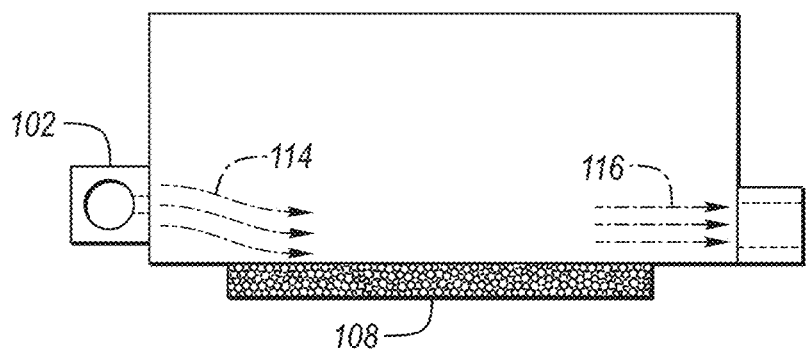
FIG. 3B is a schematic, side view of an SLM build chamber depicting a shielding gas flow from an inlet rail towards an outlet.

The simulated shielding gas flow is subsequently utilized to simulate shielding gas flow and metallic powder particle interaction. A reduced scale fluid-particle (e.g., a CFD-DEM method) may be used to simulate shielding gas flow and metallic powder particle interaction. FIG. 3B depicts a schematic, side view of SLM build chamber 100 shown in FIG. 3A. As shown in FIG. 3B, the shielding gas starts to flow from inlet rail 102 within a pre-determined value for an inlet boundary condition as signified by arrows 114. The shielding gas flows over powder bed 108. The shielding gas flows toward outlet 110 as signified by arrows 116. The metallic powder particles of powder bed 108 are initially settled in powder bed 108, as shown in FIG. 3B.

Figure 3C:
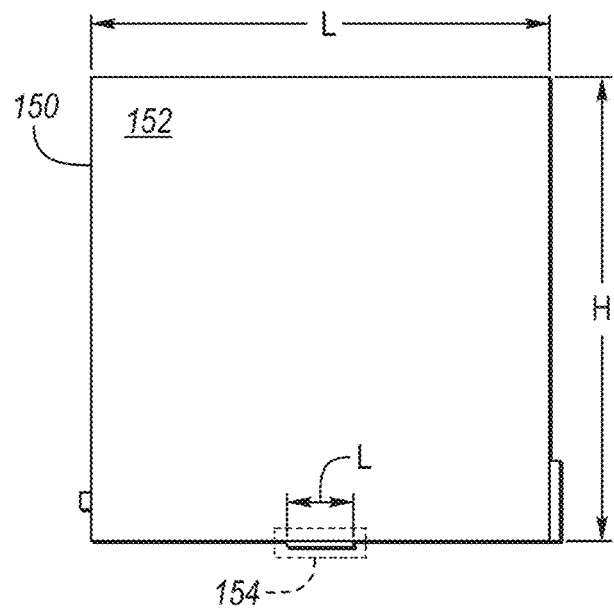
FIG. 3C is a schematic, side view of an SLM build chamber showing a gas fluid domain and a powder bed domain configured for use with one or more steps of a computational method to simulate interactions between a shielding gas flow and metallic powder particles.

FIG. 3C depicts a schematic, side view of SLM build chamber 150 showing gas fluid domain 152 and powder bed domain 154 configured for use with one or more steps of a computational method to simulate interactions between a shielding gas flow and metallic powder particles. Powder bed domain 154 is situated at the bottom of gas fluid domain 152, as shown in FIG. 3C. The length (L) of gas fluid domain 152 may be about 30 mm. The height (H) of gas fluid domain 152 may be about 30 mm. The width (W) of gas fluid domain may be about 0.4 mm. The length (L) of powder bed domain 154 may be about 4 mm. The height (H) of powder bed domain 154 may be about 0.2 mm. The depth (D) of powder bed domain 154 may be about 0.4 mm. In one or more embodiments, the volume of gas fluid domain 152 is relatively much larger (e.g., 90, 92, 94 or 96%) than powder bed domain 154 to ensure the shielding gas flow maintains a steady flow stream upon the powder bed.

Figure 4A:
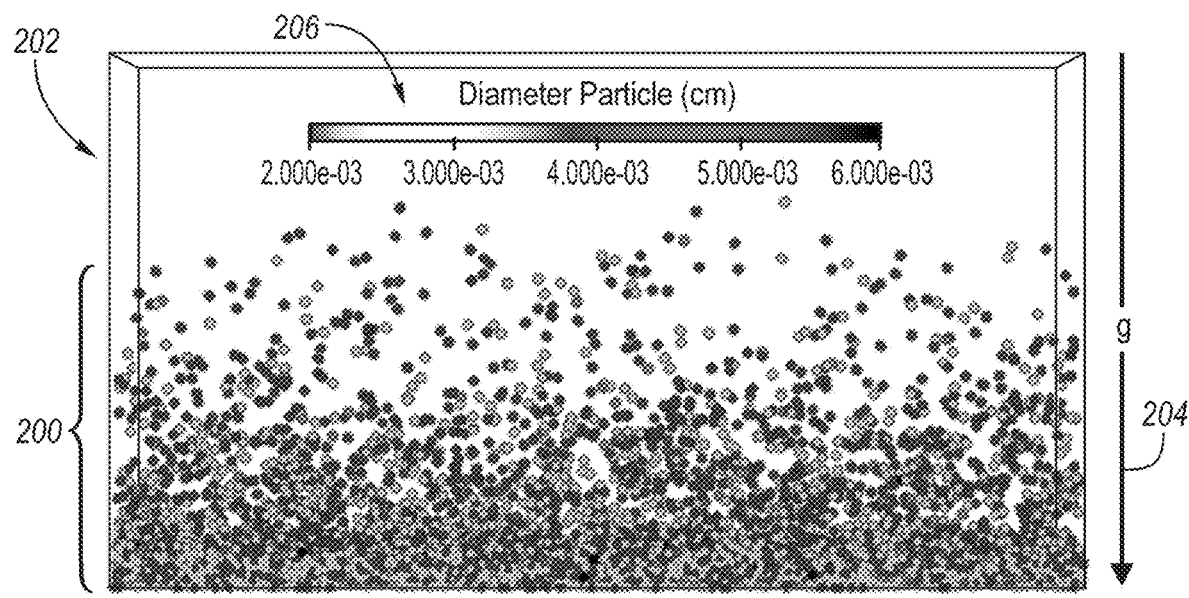
FIG. 4A depicts a schematic, perspective view of different sized metallic powder particles falling within a container under the force of gravity.
Figure 4B:
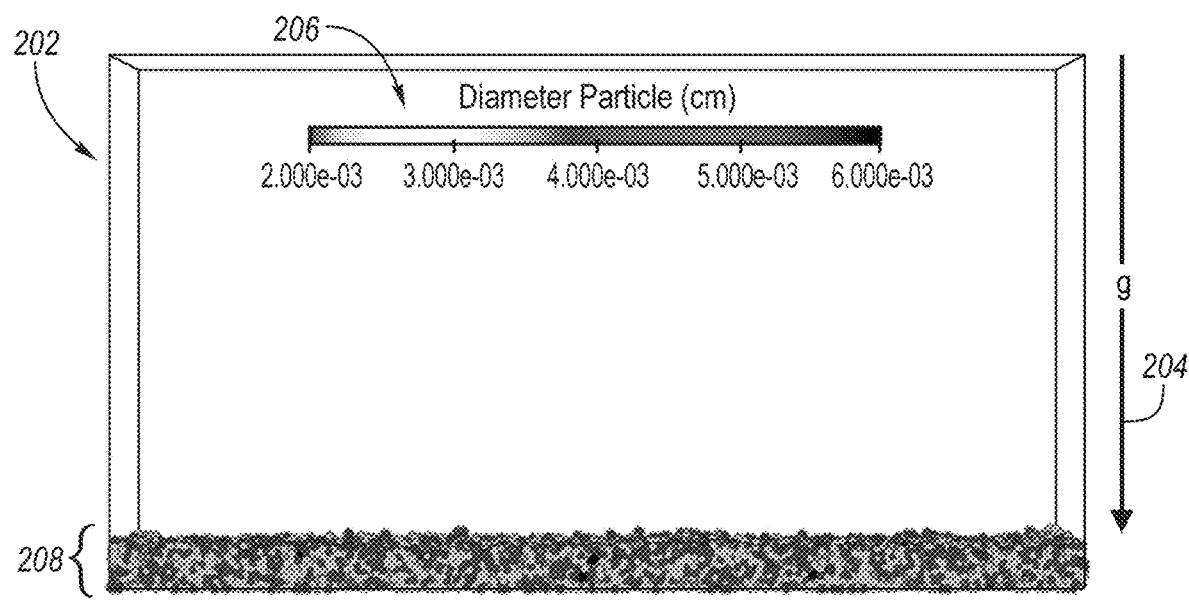
FIG. 4B depicts a schematic, perspective view of a settled powder bed after different sized metallic powder particles have fallen within the container under the force of gravity (g).

The computational method to simulate shielding gas flow and metallic powder particle interaction may include first and second steps. The first step may include generating a powder bed. One method of generating the powder may include a rain-drop method, where a pre-determined number of different sized metallic powder particles fall freely within a container under the effects of gravity. FIG. 4A depicts a schematic, perspective view of different sized metallic powder particles 200 falling within container 202 under the force of gravity (g), signified by downward arrow 204. As depicted by legend 206, the different sizes of metallic powder particles 200 may have a diameter of about 2.000e-03 to 6.000e-03. FIG. 4B depicts a schematic, perspective view of settled powder bed 208 after different sized metallic powder particles 200 have fallen within container 202 under the force of gravity (g). In one embodiment, settled powder bed 208 is imported into powder bed 108 of FIG. 3A as the initial state for determining an interaction between a shielding gas flow and metallic powder particles. The shielding gas is assigned pre-determined flow properties. Based on these pre-determined flow properties, the shielding gas enters an inlet and exits from an outlet. This flow of shielding gas may cause metallic powder particles to be removed from the powder bed if the flow velocity exceeds a threshold flow velocity.

In one or more embodiments, different sized metallic powder particles are treated as perfect spheres with different diameters. According to the computation methods disclosed herein, the X, Y and Z directional velocities of individual metallic powder particles (including without limitation translational and rotational components) may be determined using Newton's second law of motion. The computational methods disclosed herein may also determine and account for the drag force due to the volume fraction of powder particles and particle-fluid interaction.

In one embodiment, the density and viscosity of the shielding gas for use with one or more computational methods is about 1.225 kg/m$^3$ and about 0.00001781 kg/m-s, respectively. In certain embodiments, the shielding gas density may be any of the following values or in a range of any two of the following values: 1.0, 1.2, 1.4, 1.6, 1.8 and 2.0 kg/m$^3$. In certain embodiments, the shielding gas viscosity may be any of the following values or in a range of any two of the following values: 0.00001700, 0.00001800, 0.00001900, 0.00002000, 0.00002100 and 0.00002200 kg/m-s. In one embodiment, the density of the metallic powder particles for use with one or more computational methods is about 7,710 kg/m$^3$. In certain embodiments, the density of the metallic powder particles may be any of the following values or in a range of any two of the following values: 2,000, 4,000, 6,000, 8,000, 10,000 and 12,000 kg/m$^3$. In one embodiment, the size distribution of the metallic powder particles is in a range of about 18.8 μm (D10) to about 60.3 μm (D90), with a mean diameter of 36.7 μm.

FIG. 5A depicts a schematic, perspective view of SLM build chamber 100 showing vertical flow velocity plane 118 and horizontal flow velocity plane 120 of a shielding gas flow within main chamber 106 of SLM build chamber 100 using a pre-determined inlet shielding gas flow rate and a CFD computational method according to one embodiment. FIG. 5B depicts a schematic, plan view of horizontal flow velocity plane 120. FIG. 5C depicts a schematic, plan view of vertical flow velocity plane 118. The regions of different shading in velocity planes 118 and 120 represent different velocities in m/s. Legend 122 shows the different shading correlated to the velocity in the range of 0.000e+00 and 1.300e+00. As shown in FIG. 5A, horizontal flow velocity plane 120 is taken at a pre-determined distance above powder bed 108. According to the computational method shown in FIG. 5A, the pre-determined distance is about 1 mm. In certain embodiments, the pre-determined distance may be any of the following values or in a range of any two of the following values: 0, 0.1, 0.2, 0.3, 0.4, 0.5, 0.6, 0.7, 0.8, 0.9 and 1.0 mm.

The velocity planes 118 and 120 of FIG. 5A are generated using an inlet shielding gas flow rate of 250 liter/minute. In other embodiments, the pre-determined inlet shielding gas flow rate may be any of the following values or in a range of any two of the following values: 10, 100, 1,000 and 10,000 liter/minute. As can be seen by FIG. 5A, the flow velocity of the inlet shielding gas is not evenly distributed within main chamber 106. In one embodiment, the computational method determines the interaction between the metallic powder particles in powder bed 108 at regions in which the flow velocity is within a relatively high range (e.g., 1, 2, 3, 4, 5, 10 or 20% of the maximum flow velocity). If the metallic powder particles in powder bed 108 are not affected by gas flow at the high velocity regions, the metallic powder particles at low velocity regions are also not affected by gas flow.

As shown in FIG. 5B, the maximum flow velocity above powder bed 108 is about 1.3 m/s. The metallic powder particles in a maximum velocity region may be subject to uptake due to gas flow-particle interaction when the maximum gas flow rate reaches a threshold value. The maximum flow velocity at the pre-determined distance above powder bed 108 determines a powder particle uptake condition. If the maximum flow velocity at the pre-determined distance above powder bed 108 is less than the threshold velocity for powder particle uptake, then none of powder bed 108 is subject to the powder uptake condition.

Figure 6:
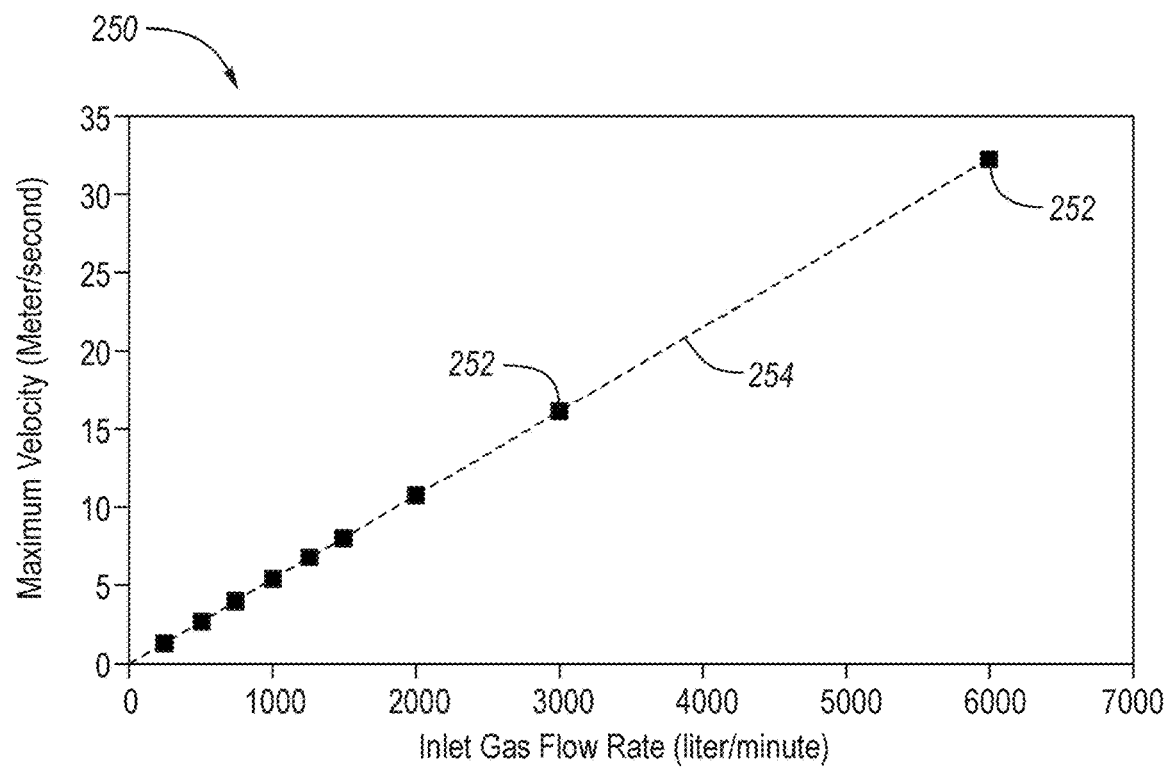
FIG. 6 is a graph depicting a functional relationship between maximum velocity (m/s) based on an inlet gas flow rate (L/m) at a pre-determined distance of 1 mm above a powder bed according to one embodiment.

FIG. 6 is graph 250 depicting a functional relationship between maximum velocity (meter/second or m/s) based on an inlet gas flow rate (Liter/minute or L/m) at a pre-determined distance of 1 mm above powder bed 108. Data points 252 are determined using the computational method of one or more embodiments. Dotted line 254 is a fitted line through data points 252. As can be seen in FIG. 6, the maximum velocity increases linearly with the increase of inlet flow rate. The linear relationship shown in FIG. 6 is y(maximum velocity in m/s) equals 0.0055x(inlet gas flow rate (L/m) minus 0.0925. The functional relationship shown in FIG. 6 may be used to correlate gas flow velocities that do not create the powder particle uptake condition to the inlet flow rate in response to an identified threshold velocity.

Figure 7A:
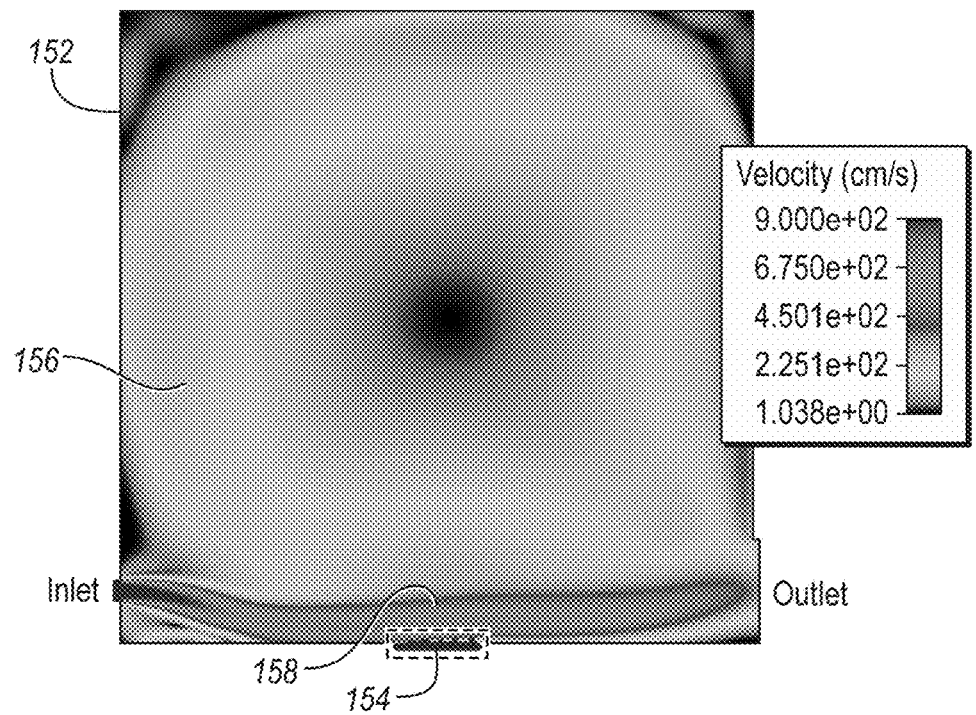
FIG. 7A is an image of a velocity contour within gas fluid domain 152 taken in a vertical velocity plane in response to a pre-determined inlet flow velocity according to one embodiment.
Figure 7B:
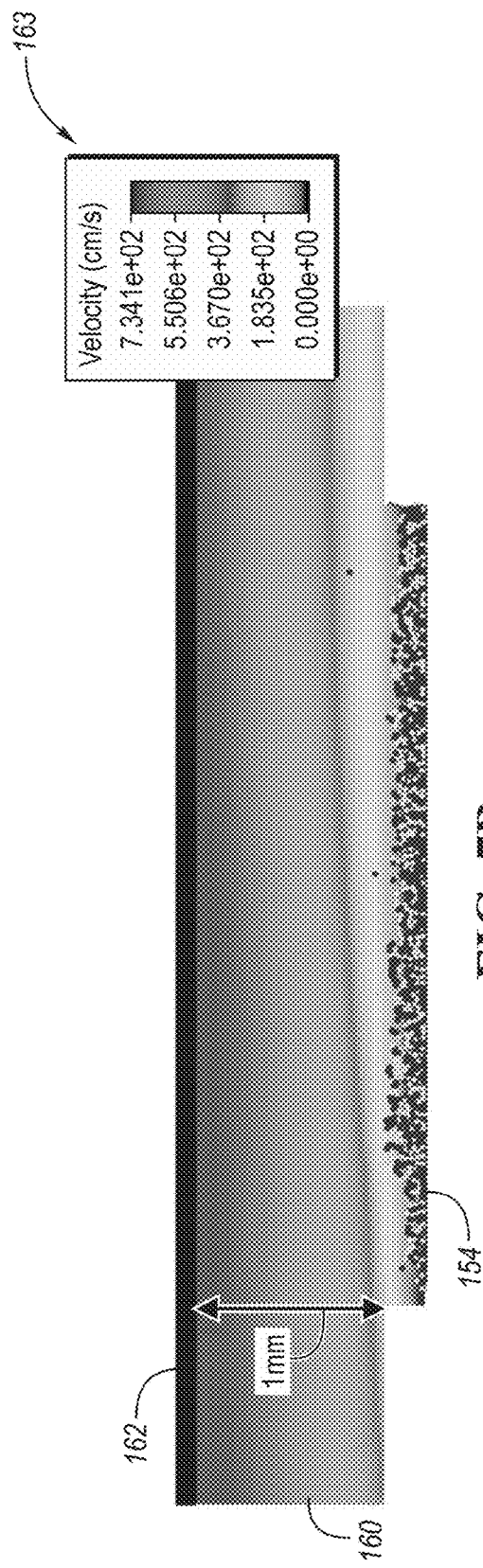
FIG. 7B is an image of a velocity contour taken in a vertical velocity plane in a region between a powder bed domain and a pre-determined distance above a powder bed domain according to one embodiment.
Figure 7C:
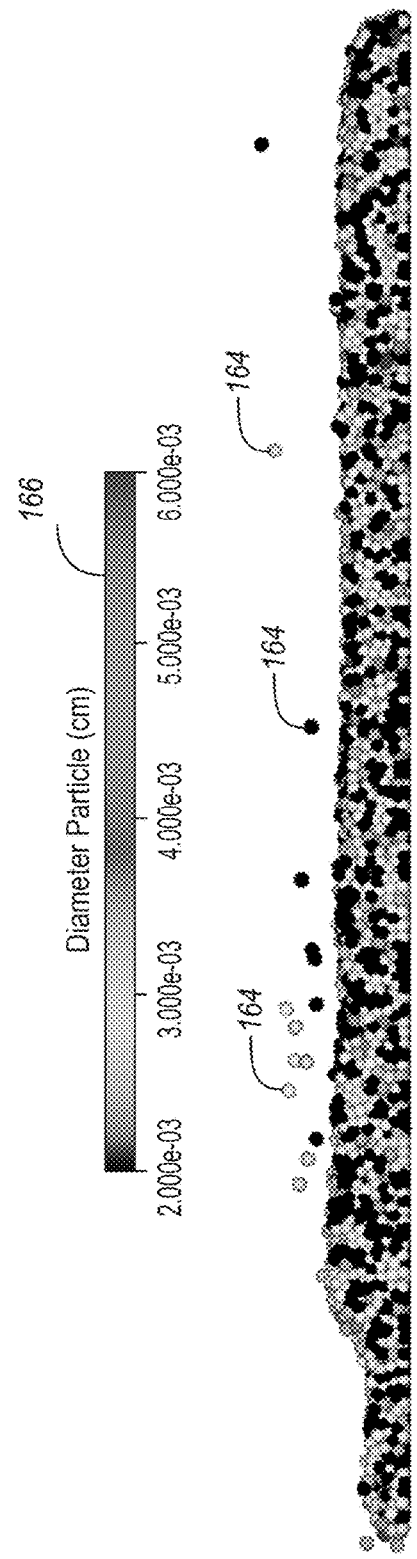
FIG. 7C is an image of particles up taken from particles of a powder bed domain according to one embodiment.

FIG. 7A is an image of velocity contour 156 within gas fluid domain 152 taken in a vertical velocity plane in response to a pre-determined inlet flow velocity. In the computational method used for FIG. 7A, the inlet flow velocity is 9 m/s. As shown in FIG. 7A, steady flow stream 158 is formed over powder bed domain 154. Legend 160 indicates that the velocity of steady flow stream 158 of about is less than the inlet flow velocity of 9 m/s due to turbulence and other factors. FIG. 7B is an image of velocity contour 160 taken in a vertical velocity plane in a region between powder bed domain 154 and pre-determined distance 162 above powder bed domain 154. As shown in FIG. 7B, the pre-determined distance 162 is 1 mm. FIG. 7C is an image of particles 164 up taken from particles of powder bed domain 154. As shown in legend 163 of FIG. 7B, the maximum gas velocity at the pre-determined distance is 7.34 m/s, and at this maximum gas velocity, particles 164 are up taken from particles of powder bed domain 154. Legend 166 shows shading for different particle sizes. According to the computational methods of one or more embodiments, this particle uptake condition is controlled.

Figure 8A:
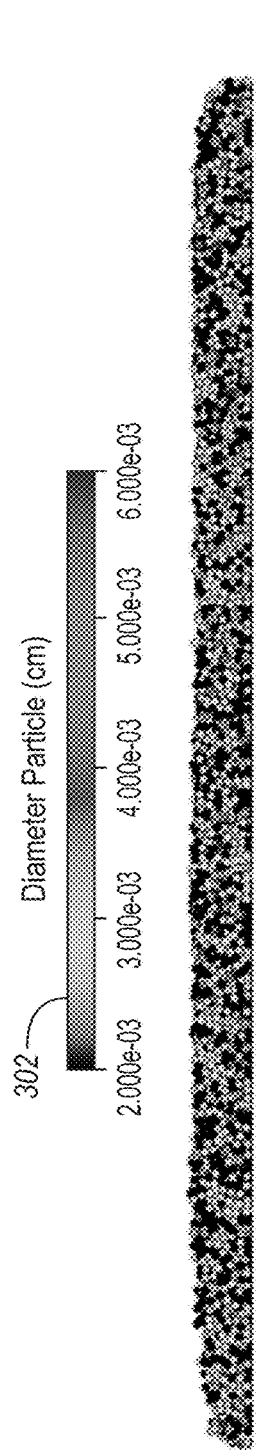
FIGS. 8A, 8B and 8C are images of powder bed in which different inlet gas velocities have been applied.
Figure 8B:
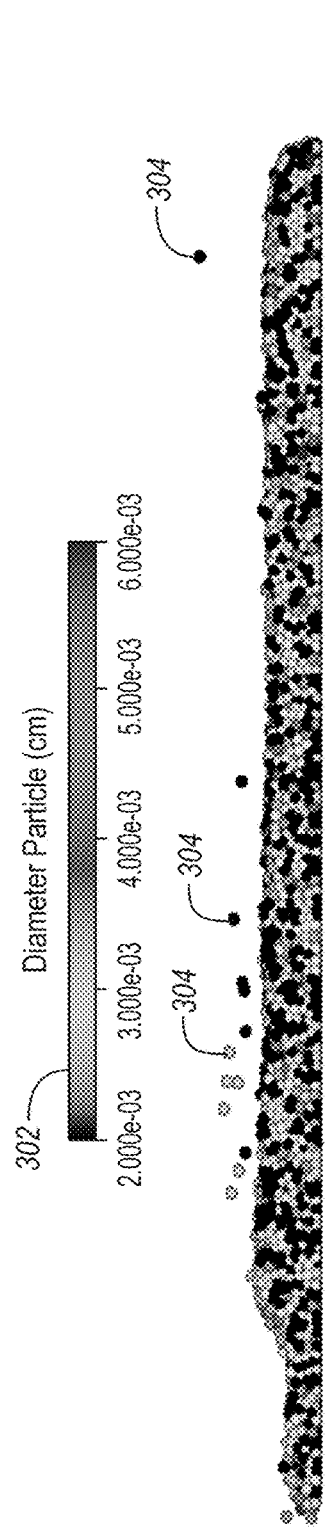
Figure 8C:
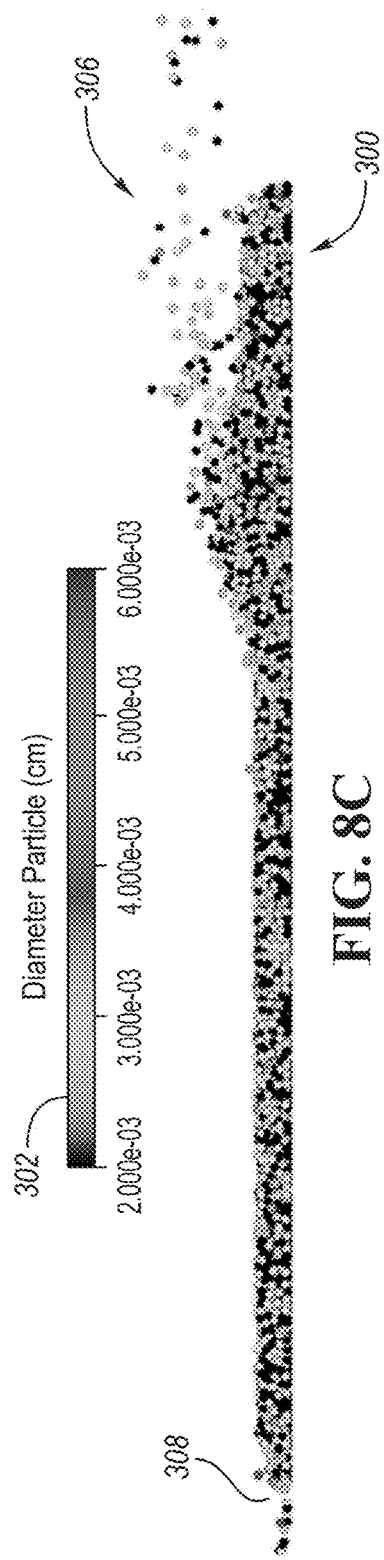

Different maximum velocities at the pre-determined distance may be obtained by varying the inlet gas velocity of the computational methods of one or more embodiments. FIGS. 8A, 8B and 8C depicts images of powder bed 300 at different inlet gas velocities of 6.53 m/s, 7.34 m/s and 8.19 m/s. FIGS. 8A, 8B and 8C include legend 302 showing shading for different particle sizes. As shown in FIG. 8A, no particles in powder bed 300 are up taken by the inlet gas flow. As shown in FIG. 8B, particles 304 are up taken from powder bed 300. As shown in FIG. 8C, particles 306 are up taken from powder bed 300 and region 308 is almost exposed in the underlying substrate. Accordingly, with increased gas velocity, individual powder particles may be gradually blown away from their initial locations, and the powder bed becomes thinner and the surface morphology of powder bed 300 changes significantly. Moreover, some regions (e.g., region 308) may have no powder particles on the underlying substrate. As shown in FIGS. 8A, 8B and 8C via the computational methods of one or more embodiments, the maximum velocity of 7.34 m/s at the pre-determined distance of 1 mm shows an early stage of the powder particle uptake condition. According to the computational methods of one or more embodiments, this maximum velocity may be used as a threshold velocity for the powder particle uptake condition in response to the specific powder material and shielding gas parameters used.

Figure 9A:
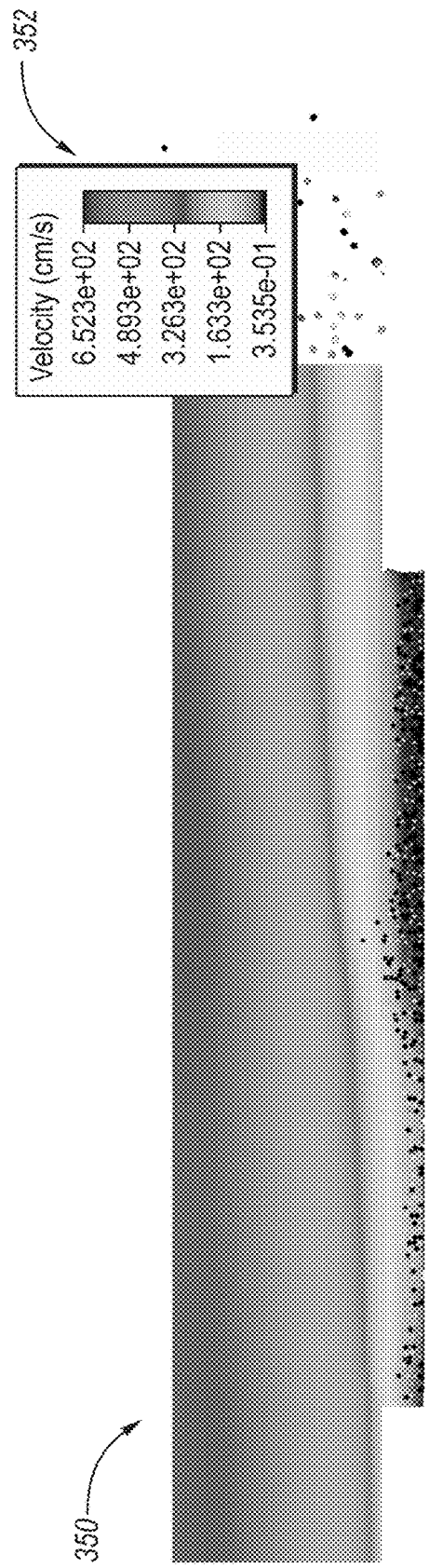
FIG. 9A shows an image of a velocity contour within a gas fluid domain and above a powder bed domain 154 taken in a vertical velocity plane in response to a pre-determined inlet flow velocity based on certain powder particle and gas parameters according to one embodiment.
Figure 9B:
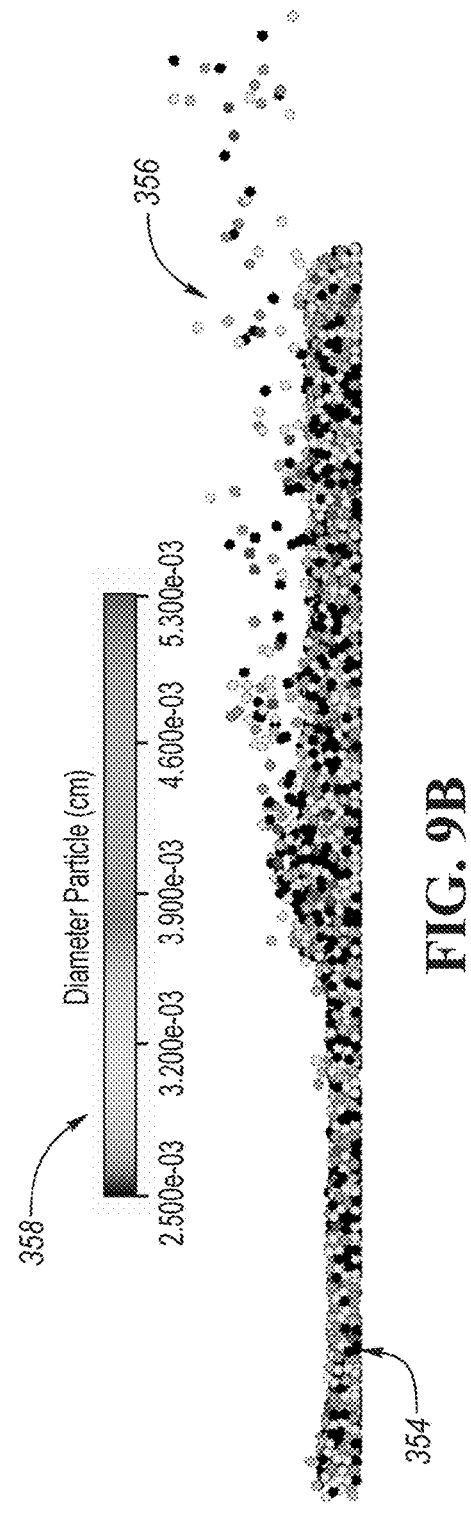
FIG. 9B shows an image of powder particle uptake in response to a pre-determined inlet flow velocity based on certain powder particle and gas parameters according to one embodiment.

The computational methods can be applied to varied powder and gas parameters. FIG. 9A shows an image of velocity contour 350 within gas fluid domain 152 and above powder bed domain 154 taken in a vertical velocity plane in response to a pre-determined inlet flow velocity based on certain powder particle and gas parameters. In this embodiment, the shielding gas has a density of 1.6228 kg/m$^3$ and a viscosity of 0.00002125 kg/m-s. In this embodiment, the powder particles have a density of 4,420 kg/m$^3$ and the size distribution of the powder particles are between 25 µm (D10) and 53 µm (D90) with a mean diameter of 38 µm. Legend 352 shows different shading for different velocities within velocity contour 350. FIG. 9B shows an image of powder particle bed 354 within powder bed domain 154 upon application of velocity contour 350. As shown in FIG. 9B, particles 356 are up taken from powder particle bed 354 at a maximum velocity of 6.523 m/s from an inlet volume flow rate of about 1,000 to 1,500 Liter/minute. According to the computational methods of one or more embodiments, the input velocity may be reduced to determine a threshold velocity for a powder particle uptake condition, such that the condition may be controlled.

The following application is related to the present application: U.S. patent application Ser. No. 16/592,250, filed on Oct. 3, 2019, and issued as U.S. Pat. No. 11,584,079 on Feb. 21, 2023. The identified application is incorporated by reference herein in its entirety.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A laser additive manufacturing system for controlling a powder particle uptake by a shielding gas, the system comprising:
   an inlet configured to inlet a shielding gas flow;
   a main chamber configured to receive the shielding gas flow;
   an outlet configured to outlet the shielding gas flow;
   a substrate situated between the inlet and the outlet and configured to support a powder bed having a number of particles;
   a laser configured to melt pre-defined regions of the powder bed to form a melt pool; and
   a controller having non-transitory memory for storing machine instructions that are to be executed by the controller and operatively connected to the inlet, the machine instructions when executed by the controller implement the following functions:
      receiving a gas fluid domain of the main chamber, a powder bed domain of the powder bed, and an inlet shielding gas flow velocity;
      determining a maximum gas flow velocity within the gas fluid domain based on the inlet shielding gas flow velocity and the gas fluid domain;
      determining a threshold uptake flow velocity within the gas fluid domain based on the inlet shielding gas flow velocity and the powder bed domain; and
      adjusting the inlet shielding gas flow velocity in response to a comparison of the maximum gas flow velocity and the threshold uptake flow velocity to control the powder particle uptake of the shielding gas in the laser additive manufacturing system.

2. The system of claim 1, wherein the determining the maximum gas flow velocity function includes determining the maximum gas flow velocity within the gas fluid domain in a horizontal plane offset from the powder bed domain based on the inlet shielding gas flow velocity and the gas fluid domain.

3. The system of claim 1, wherein the adjusting function includes reducing the inlet shielding gas flow velocity in response to the maximum gas flow velocity being greater than the threshold uptake flow velocity.

4. The system of claim 1, wherein the adjusting function including increasing the inlet shielding gas flow velocity in response to the maximum gas flow velocity being less than the threshold uptake flow velocity.

5. The system of claim 1, wherein the determining the maximum gas flow velocity function is carried out using a computational fluid dynamics (CFD).

6. The system of claim 1, wherein the determining the threshold uptake flow velocity function is carried out using a computational fluid dynamics discrete element method (CFD-DEF).

7. A computational method for controlling a powder particle uptake by a shielding gas in a laser additive manufacturing system, the method comprising:
- receiving a gas fluid domain, a powder bed domain, and an inlet shielding gas flow velocity of the laser additive manufacturing system;
- determining a maximum gas flow velocity within the gas fluid domain based on the inlet shielding gas flow velocity and the gas fluid domain;
- determining a threshold uptake flow velocity within the gas fluid domain based on the inlet shielding gas flow velocity and the powder bed domain; and
- adjusting the inlet shielding gas flow velocity in response to a comparison of the maximum gas flow velocity and the threshold uptake flow velocity to control the powder particle uptake of the shielding gas in the laser additive manufacturing system.

8. The computational method of claim 7, wherein the determining the maximum gas flow velocity step includes determining the maximum gas flow velocity within the gas fluid domain in a horizontal plane offset from the powder bed domain based on the inlet shielding gas flow velocity and the gas fluid domain.

9. The computational method of claim 7, wherein the adjusting step includes reducing the inlet shielding gas flow velocity in response to the maximum gas flow velocity being greater than the threshold uptake flow velocity.

10. The computational method of claim 7, wherein the adjusting step including increasing the inlet shielding gas flow velocity in response to the maximum gas flow velocity being less than the threshold uptake flow velocity.

11. The computational method of claim 7, wherein the determining the maximum gas flow velocity step is carried out using a computational fluid dynamics (CFD).

12. The computational method of claim 7, wherein the determining the threshold uptake flow velocity step is carried out using a computational fluid dynamics discrete element method (CFD-DEF).

13. The computational method of claim 7, wherein the powder bed domain includes one or more powder particle parameters.

14. The computational method of claim 7, wherein the gas fluid domain includes one or more inlet shielding gas parameters.

15. A computer readable medium comprising:
- a non-transitory memory for storing machine instructions that are to be executed by a computer, the machine instructions when executed by the computer implement the following functions:
  - receiving a gas fluid domain, a powder bed domain, and an inlet shielding gas flow velocity of a laser additive manufacturing system;
  - determining a maximum gas flow velocity within the gas fluid domain based on the inlet shielding gas flow velocity and the gas fluid domain;
  - determining a threshold uptake flow velocity within the gas fluid domain based on the inlet shielding gas flow velocity and the powder bed domain; and
  - adjusting the inlet shielding gas flow velocity in response to a comparison of the maximum gas flow velocity and the threshold uptake flow velocity to control a powder particle uptake of a shielding gas in the laser additive manufacturing system in response to the maximum gas flow velocity and the threshold uptake flow velocity.

16. The computer readable medium of claim 15, wherein the machine instructions when executed by the computer implement the further function of determining the maximum gas flow velocity within the gas fluid domain in a horizontal plane offset from the powder bed domain based on the inlet shielding gas flow velocity and the gas fluid domain.

17. The computer readable medium of claim 15, wherein the machine instructions when executed by the computer implement the further function of increasing the inlet shielding gas flow velocity in response to the maximum gas flow velocity being less than the threshold uptake flow velocity.

18. The computer readable medium of claim 15, wherein the machine instructions when executed by the computer implement the further function of reducing the inlet shielding gas flow velocity in response to the maximum gas flow velocity being greater than the threshold uptake flow velocity.

19. The system of claim 1, wherein the maximum gas flow velocity is a maximum gas flow velocity at a pre-determined distance above the powder bed, and the threshold uptake flow velocity is a threshold uptake flow velocity at the pre-determined distance for powder particle uptake.

20. The method of claim 7, wherein the maximum gas flow velocity is a maximum gas flow velocity at a pre-determined distance above the powder bed, and the threshold uptake flow velocity is a threshold uptake flow velocity at the pre-determined distance for powder particle uptake.

* * * * *